US010868048B2

(12) United States Patent
Park

(10) Patent No.: US 10,868,048 B2
(45) Date of Patent: Dec. 15, 2020

(54) DISPLAY APPARATUS AND METHOD OF MANUFACTURING THE SAME

(71) Applicant: Samsung Display Co., Ltd., Yongin-Si (KR)

(72) Inventor: Sangil Park, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 16/252,853

(22) Filed: Jan. 21, 2019

(65) Prior Publication Data
US 2019/0172852 A1 Jun. 6, 2019

Related U.S. Application Data

(62) Division of application No. 15/135,773, filed on Apr. 22, 2016, now Pat. No. 10,243,011.

(30) Foreign Application Priority Data

Aug. 31, 2015 (KR) .................. 10-2015-0123191

(51) Int. Cl.
H01L 33/38 (2010.01)
H01L 33/62 (2010.01)
H01L 33/20 (2010.01)
H01L 25/16 (2006.01)
H01L 25/075 (2006.01)
H01L 27/12 (2006.01)
H01L 27/15 (2006.01)
G09F 9/33 (2006.01)
H01L 33/44 (2010.01)

(52) U.S. Cl.
CPC ............ *H01L 27/1248* (2013.01); *G09F 9/33* (2013.01); *H01L 25/0753* (2013.01); *H01L 33/44* (2013.01); *H01L 33/62* (2013.01)

(58) Field of Classification Search
CPC .............................. H01L 25/167; H01L 33/38
See application file for complete search history.

(56) References Cited

U.S. PATENT DOCUMENTS 7,888,690 B2 2/2011 Iwafuchi et al.
8,573,469 B2 11/2013 Hu et al.
(Continued)

FOREIGN PATENT DOCUMENTS

JP 2001-324946 A 11/2001
KR 20030007065 A 1/2003
KR 1020140112486 A 9/2014

Primary Examiner — Omar F Mojaddedi
(74) Attorney, Agent, or Firm — Cantor Colburn LLP

(57) ABSTRACT

A display apparatus includes a display substrate including a first electrode member; and a light-emitting diode ("LED") on the display substrate and connected to the first electrode member of the display substrate. The first electrode member includes: a first electrode, and a protruding portion which protrudes from an upper surface of the first electrode. The LED includes a p-n diode, a first contact electrode disposed at a side of the p-n diode, and an insulating member surrounding the first contact electrode and in which an opening is defined which exposes a surface of the first contact electrode. The protruding portion of the first electrode member extends into the opening of the light-emitting diode and is in contact with the exposed surface of the first contact electrode.

8 Claims, 9 Drawing Sheets

(56) References Cited

U.S. PATENT DOCUMENTS

| | | | |
|---|---|---|---|
| 2003/0010970 A1* | 1/2003 | Hara | H01L 24/83 257/9 |
| 2008/0265744 A1* | 10/2008 | Doi | H01L 33/62 313/498 |
| 2012/0126229 A1 | 5/2012 | Bower | |
| 2013/0130416 A1* | 5/2013 | Bibl | H01L 21/67144 438/21 |
| 2013/0285086 A1* | 10/2013 | Hu | H01L 27/156 257/98 |
| 2014/0159064 A1 | 6/2014 | Sakariya | H01L 25/0753 257/88 |
| 2015/0137153 A1* | 5/2015 | Bibl | H01L 33/44 257/88 |
| 2016/0056204 A1 | 2/2016 | Sakariya | H01L 27/124 257/88 |
| 2016/0163765 A1* | 6/2016 | Hu | H01L 33/62 257/93 |
| 2016/0197232 A1 | 7/2016 | Bour | H01L 33/20 257/13 |

\* cited by examiner

DISPLAY APPARATUS AND METHOD OF MANUFACTURING THE SAME

This application is a divisional application of U.S. application Ser. No. 15/135,773 filed Apr. 22, 2016, which claims priority to Korean Patent Application No. 10-2015-0123191, filed on Aug. 31, 2015, and all the benefits accruing therefrom under 35 U.S.C. § 119, the content of which in its entirety is herein incorporated by reference.

BACKGROUND

1. Field

One or more exemplary embodiments relate to a display apparatus and a method of manufacturing the same.

2. Description of the Related Art

A light-emitting diode ("LED") converts an electrical signal into light such as infrared rays or visible rays according to the characteristics of a compound semiconductor. LEDs have been used for home appliances, remote controls, electronic display boards, various kinds of automated devices, and the like. LEDs have been widely used in electronic devices such as miniaturized handheld electronic and large display apparatuses.

SUMMARY

One or more exemplary embodiments include a display apparatus and a method of manufacturing the same.

According to one or more exemplary embodiments, a display apparatus includes: a display substrate including a first electrode member; and a light-emitting diode ("LED") on the display substrate and connected to the first electrode member of the display substrate. The first electrode member includes: a first electrode, and a protruding portion which protrudes from an upper surface of the first electrode. The LED includes a p-n diode, a first contact electrode at a side of the p-n diode, and an insulating member surrounding the first contact electrode and in which an opening is defined which exposes a surface of the first contact electrode. The protruding portion of the first electrode member extends into the opening of the LED and is in contact with the exposed surface of the first contact electrode.

A horizontal cross-sectional area of the opening may increase in a direction from the first contact electrode to the first electrode.

The insulating member may define an inclined inner side surface thereof which defines the opening and has a first gradient, and the protruding portion may define an inclined outer side surface thereof which faces the inner side surface of the insulating member and has a second gradient.

The second gradient may be equal to or less than the first gradient.

The opening defined in the insulating member may be recessed from a lower surface thereof. A maximum depth of the opening taken from the lower surface of the insulating member to the exposed surface of the first contact electrode may be equal to or less than a maximum height of the protruding portion.

A vertical cross-section of the protruding portion may be trapezoidal.

The display substrate may further include a bank layer which defines a pixel region and a concave portion in which the LED is accommodated. The display apparatus may include a passivation layer surrounding the LED accommodated in the concave portion and filling a space between the LED and the bank layer.

The LED may include a second contact electrode at a side of the p-n diode opposite the side at which the first contact electrode is disposed, and the second contact electrode of the LED may be exposed by the passivation layer surrounding the LED.

The display apparatus may further include a second electrode disposed on the passivation layer and in contact with the second contact electrode exposed by the passivation layer.

The display substrate may further include a substrate, a thin-film transistor on the substrate, and a planarization layer between the thin-film transistor and the first electrode. The first electrode may be electrically connected to the thin-film transistor.

According to one or more exemplary embodiments, a method of manufacturing a display apparatus includes: forming a plurality of LEDs of the display apparatus by: arranging a plurality of p-n diodes spaced apart from each other on a carrier substrate; disposing a first contact electrode at a side of each of the plurality of p-n diodes on the carrier substrate, respectively; forming an insulating layer on the carrier substrate with the plurality of p-n diodes and the first contact electrodes thereon; and patterning the insulating layer on the carrier substrate to form an insulating member surrounding the first contact electrode at the side of each of the plurality of p-n diodes, respectively; and mounting the LEDs on a display substrate having a first electrode at the side of each of the plurality of p-n diodes, respectively. The insulating member defines an opening thereof through which a surface of the first contact electrode is exposed, and the first electrode member includes a first electrode and a protruding portion which protrudes from an upper surface of the first electrode, the protruding portion extending into the opening to contact the exposed surface of the first contact electrode.

A horizontal cross-sectional area of the opening may increase in a direction from the first contact electrode to the first electrode.

A vertical cross-section of the protruding portion may be trapezoidal.

The insulating member may define an inner side surface thereof at the opening, and the inner side surface is an inclined surface having a first gradient with respect to the first electrode, and the protruding portion may define an outer side surface thereof which faces the inner side surface of the insulating member, and the outer side surface is an inclined surface having a second gradient with respect to the first electrode.

The second gradient may be equal to or less than the first gradient.

The opening defined in the insulating member may be recessed from a lower surface thereof. A maximum height of the protruding portion may be equal to or greater than a maximum depth of the opening taken from the lower surface of the insulating member to the exposed surface of the first contact electrode.

The display substrate may further include a substrate, a bank layer which is on the substrate, and defines a pixel region and a concave portion in plural, a thin-film transistor on the substrate, and a planarization layer between the thin-film transistor and the first electrode member. The first electrode member is electrically connected to the thin-film transistor. The mounting the formed LEDs includes mounting each of the LEDs respectively inside the concave portions of the display substrate.

The method may further include filling a space between the bank layer and the LEDs in the concave portion with a passivation layer.

The plurality of LEDs of the display apparatus may be further formed by disposing a second contact electrode at a side of each of the p-n diodes opposite to the side at which the first contact electrode is disposed, respectively, and the second contact electrode may be exposed by the passivation layer filled in the concave portion.

The method may further include disposing a second electrode on the passivation layer and in contact with the second contact electrode exposed by the passivation layer.

BRIEF DESCRIPTION OF THE DRAWINGS

These and/or other features will become apparent and more readily appreciated from the following description of the exemplary embodiments, taken in conjunction with the accompanying drawings in which:

FIGS. 6(a) and 6(b) to FIG. 9 illustrate an exemplary embodiment of a method of manufacturing the display apparatus of FIG. 1, according to the invention.

DETAILED DESCRIPTION

Figure 1:
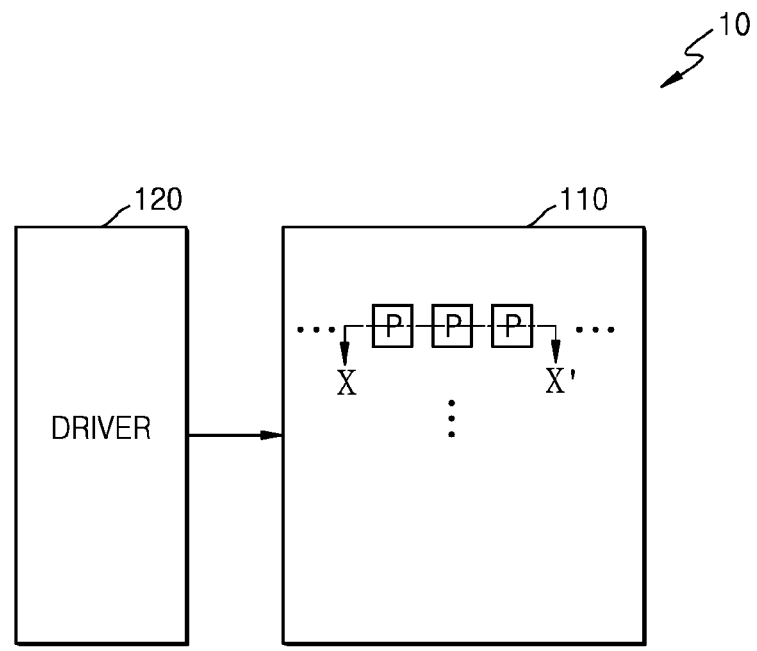
FIG. 1 illustrates a top plan view of an exemplary embodiment of a display apparatus according to the invention.

The invention may allow various kinds of change or modification and various changes in form, and specific embodiments will be illustrated in drawings and described in detail in the specification. However, it should be understood that the specific embodiments do not limit the invention to a specific disclosing form but include every modified, equivalent, or replaced one within the spirit and technical scope of the invention. In the following description, well-known functions or constructions are not described in detail so as not to obscure the invention with unnecessary detail.

Although terms, such as 'first' and 'second', can be used to describe various elements, the elements cannot be limited by the terms. The terms can be used to classify a certain element from another element.

The terminology used in the application is used only to describe specific embodiments and does not have any intention to limit the invention. An expression in the singular includes an expression in the plural unless they are clearly different from each other in context. In the accompanying drawings, some components are exaggerated, omitted, or schematically shown for convenience and clarity of description, and sizes of components do not fully reflect actual sizes thereof.

When each component is formed "on" or "under" a certain component, the terms "on" and "under" include directly or via another component in the middle, and a reference with respect to "on" and "under" is described with reference to the drawings. In contrast, when an element is referred to as being "directly on" or "directly under" another element, there are no intervening elements present.

Reference will now be made in detail to exemplary embodiments, examples of which are illustrated in the accompanying drawings, where like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain features of the present description.

As used herein, the term "and/or" includes any and all combinations of one or more of the associated listed items. Expressions such as "at least one of," when preceding a list of elements, modify the entire list of elements and do not modify the individual elements of the list. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
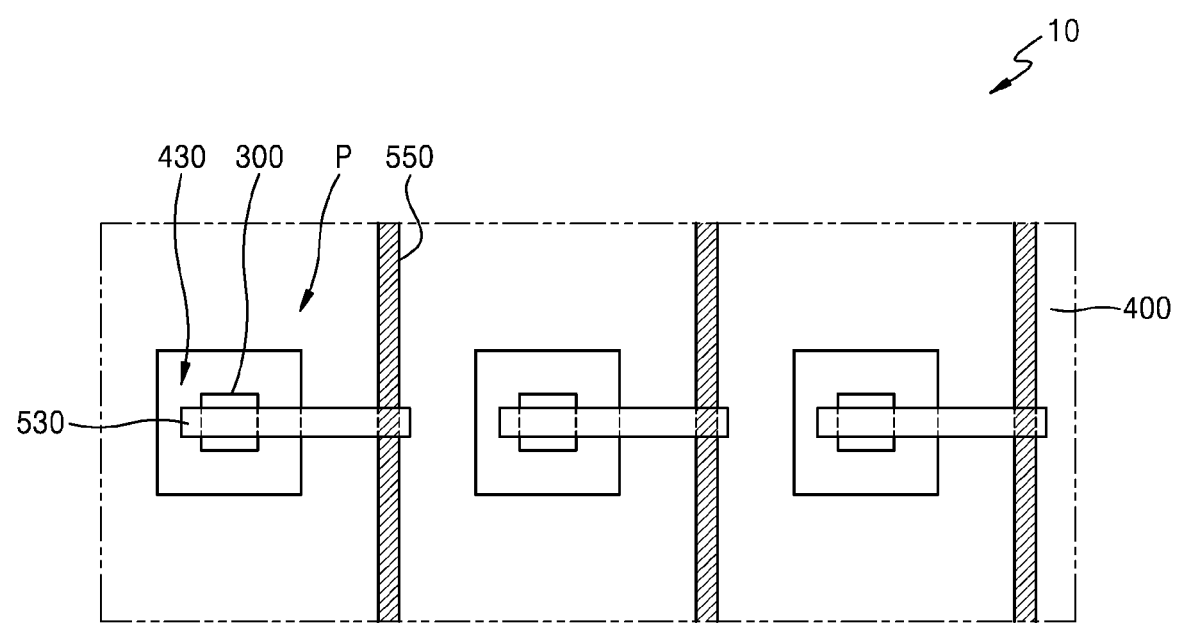
FIG. 2 illustrates an enlarged top plan view of an exemplary embodiment of pixels arranged along line X-X' in the display apparatus of FIG. 1, according to the invention.
Figure 3:
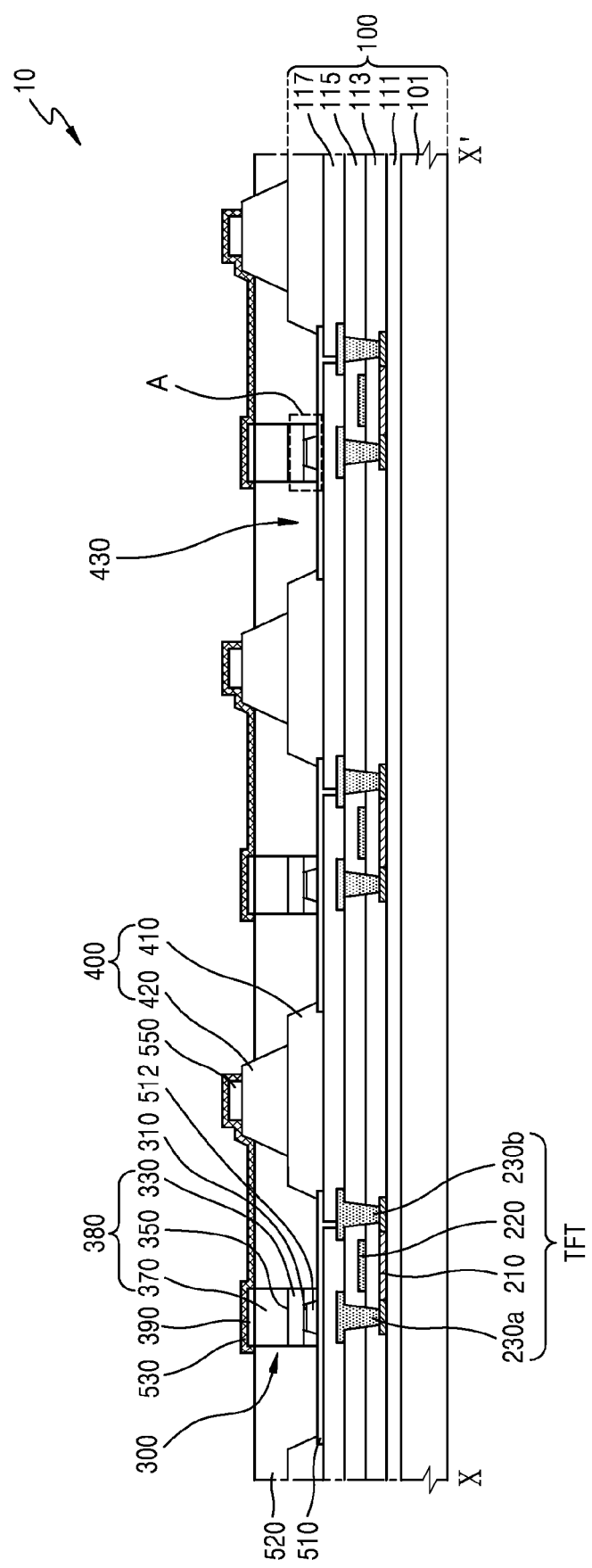
FIG. 3 illustrates a cross-sectional view of the pixels arranged along line X-X' in the display apparatus of FIG. 1, according to the invention.
Figure 4:
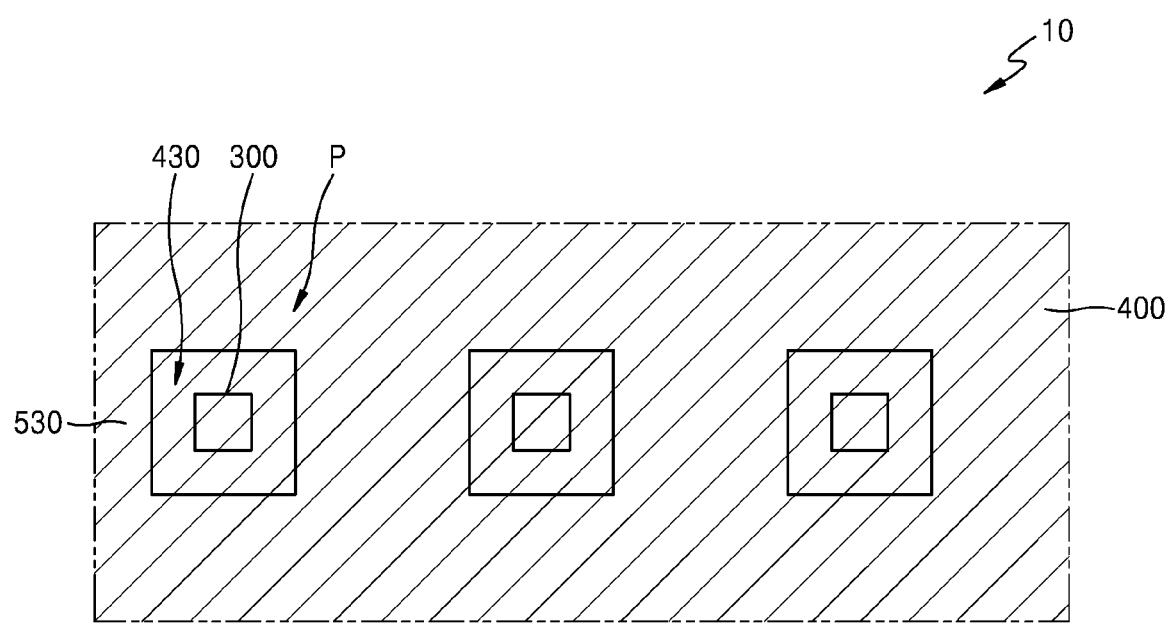
FIG. 4 illustrates a top plan view of another exemplary embodiment of the pixels arranged along line X-X' in the display apparatus of FIG. 1, according to the invention.
Figure 5:
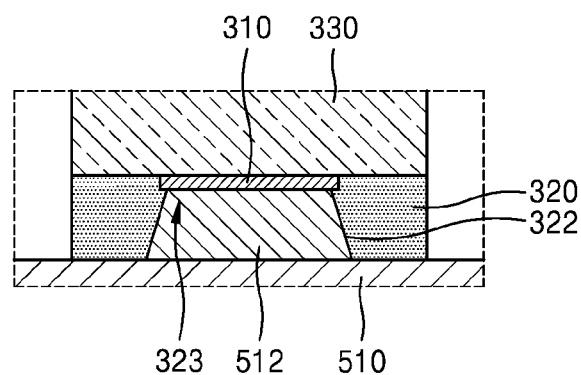
FIG. 5 is an enlarged cross-sectional view of portion A of FIG. 3.

FIG. 1 illustrates a top plan view of an exemplary embodiment of a display apparatus 10 according to the invention, FIGS. 2 and 3 respectively illustrate a top plan view and a cross-sectional view of an exemplary embodiment of pixels P arranged along line X-X' in the display apparatus 10, according to the invention, FIG. 4 illustrates a top plan view of another exemplary embodiment of the pixels P arranged along line X-X' in the display apparatus 10, according to the invention, and FIG. 5 is an enlarged cross-sectional view of portion A of FIG. 3.

Referring to FIGS. 1 to 5, an exemplary embodiment of the display apparatus 10 according to the invention may include a display substrate 100 and a light-emitting diode ("LED") 300 which is provided in plural on the display substrate 100. In addition, the display apparatus 10 may include a driver 120 configured to apply a signal to the plurality of pixels P arranged in a matrix form within a display unit 110 which displays an image.

The driver 120 may include a scan driver configured to apply a scan signal to a scan line connected to a pixel P in the display unit 110 and a data driver configured to apply a data signal to a data line connected to a pixel P in the display unit 110. The driver 120 may be located at a non-display portion of a base substrate. The non-display portion may be disposed around the display unit 110 in which the pixels P are arranged. The image may not be displayed in the non-display portion of the base substrate. The driver 120 may be disposed or formed in an integrated circuit chip form and directly mounted on the base substrate on which the display unit 110 is disposed or formed, be mounted on a flexible printed circuit film, be attached to the base substrate in a tape carrier package ("TCP") form, or be disposed formed directly on the base substrate.

The display substrate 100 may include a substrate 101, a thin-film transistor TFT on the substrate 101, a planarization layer 117 on the thin-film transistor TFT, and a first electrode 510 connected to the thin-film transistor TFT through a via hole and located on the planarization layer 117.

The substrate 101 may include various materials. In an exemplary embodiment, for example, the substrate 101 may include a transparent glass material of which a main component is silicon oxide ($SiO_2$). However, the substrate 101 is not necessarily limited thereto, and the substrate 101 may include a plastic material and thus have flexibility. The plastic material may be an insulating organic material selected from among polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide, polycarbonate ("PC"), cellulose triacetate ("TAC"), cellulose acetate propionate ("CAP"), and the like.

In an exemplary embodiment, the display apparatus 10 may be of a bottom emission type in which an image is realized in a direction toward the substrate 101. In the bottom emission type display apparatus 10, the substrate 101 includes or is formed of a transparent material. In another exemplary embodiment, the display apparatus 10 may be of a top emission type in which an image is realized in a direction opposite the substrate 101. In the top emission type display apparatus 10, the substrate 101 does not include or is not formed of a transparent material and may include a non-transparent material such as a metal.

When the substrate 101 includes a metal, the substrate 101 may include at least one of iron (Fe), chromium (Cr), manganese (Mn), nickel (Ni), titanium (Ti), molybdenum (Mo), stainless steel ("SUS"), an Invar alloy, an Inconel alloy, a Kovar alloy, and a combination thereof, but is not limited thereto.

A buffer layer 111 may be disposed or formed on the substrate 101. The buffer layer 111 may provide a flat surface at an upper part of the substrate 101 and block infiltration of foreign substances or humidity that travel through the substrate 101. In an exemplary embodiment, for example, the buffer layer 111 may include an inorganic material such as silicon oxide, silicon nitride, silicon oxynitride, aluminum oxide, aluminum nitride, titanium oxide, or titanium nitride, and/or an organic material such as polyimide, polyester, or acryl, and may include or be formed with a stacked body including a plurality of the materials described above.

The thin-film transistor TFT may include an active layer 210, a gate electrode 220, a source electrode 230a, and a drain electrode 230b.

Hereinafter, a thin-film transistor TFT as a top gate type in which the active layer 210, the gate electrode 220, and the source electrode 230a and the drain electrode 230b are sequentially disposed or formed will be described. However, the invention is not limited thereto, and various types of thin-film transistors TFT, such as a bottom gate type, may be employed.

The active layer 210 may include a semiconductor material, e.g., amorphous silicon or polycrystalline silicon. However, the invention is not limited thereto, and the active layer 210 may include various materials. In one or more embodiments, the active layer 210 may include an organic semiconductor material and the like.

In one or more other embodiments, the active layer 210 may include an oxide semiconductor material. In an exemplary embodiment, for example, the active layer 210 may include an oxide of a material selected from 12-, 13-, and 14-group metal elements such as zinc (Zn), indium (In), gallium (Ga), tin (Sn), cadmium (Cd), and germanium (Ge) and a combination thereof.

A gate insulating layer 113 may be disposed or formed on the active layer 210. The gate insulating layer 113 insulates the gate electrode 220 from the active layer 210. The gate insulating layer 113 may be a monolayer (e.g., single layer) or a multi-layer including inorganic materials such as silicon oxide and/or silicon nitride.

The gate electrode 220 may be disposed or formed on the gate insulating layer 113. The gate electrode 220 may be connected to a display unit 110 gate line (not shown) through which an on/off signal is applied to the thin-film transistor TFT.

The gate electrode 220 may include a relatively low-resistance metal material. The gate electrode 220 may be disposed or formed as a monolayer or a multi-layer including at least one of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) by taking into account adhesion to an adjacent layer, surface flatness of a layer to be stacked, processability, and the like.

An interlayer insulating layer 115 may be disposed or formed on the gate electrode 220. The interlayer insulating layer 115 insulates each of the source electrode 230a and the drain electrode 230b, from the gate electrode 220. The interlayer insulating layer 115 may be disposed or formed as a monolayer or a multi-layer including an inorganic material. In an exemplary embodiment, for example, the inorganic material may be a metal oxide or a metal nitride. In an embodiment, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), or the like.

The source electrode 230a and the drain electrode 230b may be disposed or formed on the interlayer insulating layer 115. The source electrode 230a and the drain electrode 230b may be disposed or formed as a monolayer or a multi-layer including at least one of Al, Pt, Pd, Ag, Mg, Au, Ni, Nd, Ir, Cr, Li, Ca, Mo, Ti, W, and Cu. The source electrode 230a and the drain electrode 230b are electrically connected to a source region and a drain region of the active layer 210, respectively.

The thin-film transistor TFT may be provided in plural. The planarization layer 117 may be disposed or formed on the thin-film transistors TFT. The planarization layer 117 may be disposed or formed to cover the thin-film transistors TFT such that a level (step) difference due to the thin-film transistors TFT is solved, and the planarization layer 117 may define an upper surface thereof which is flat.

The planarization layer 117 may be disposed or formed as a monolayer or a multi-layer including an organic material. The organic material may include a general-use polymer such as polymethylmethacrylate ("PMMA") or polystyrene ("PS"), a polymer derivative having a phenol group, an acrylic polymer, an imide-based polymer, an arylether-based polymer, an amide-based polymer, a fluorine-based polymer, a p-xylene-based polymer, a vinyl alcohol-based polymer, a blend thereof, or the like. Alternatively, the planarization layer 117 may be disposed or formed by a composite stacked body of an inorganic insulating layer and an organic insulating layer.

The first electrode 510 is located on the planarization layer 117. The first electrode 510 may be electrically connected to the thin-film transistors TFT. In an embodiment, the first electrode 510 may be electrically connected to the drain electrode 230b through a contact hole defined or formed in the planarization layer 117. The first electrode 510 may have various planar shapes. In an exemplary embodiment, for example, the first electrode 510 may be disposed or formed by being patterned into a discrete island shape in the top plan view. The first electrode 510 may be a portion of a first electrode member to be described later.

A bank layer 400 defining a pixel region may be disposed or formed on the planarization layer 117. The bank layer 400 may define a concave portion 430 in which the LED 300 is accommodated. The bank layer 400 may include, for example, a first bank 410 of which sidewalls thereof define or form a portion of the concave portion 430. A height of the first bank 410 may be determined depending on a height of the LED 300 and an angle of field. The heights may be taken from a common surface of the display substrate 100 or may be defined a sum of all cross-sectional thicknesses of elements of the first bank 410 and the LED respectively. A size (width) of the concave portion 430 may be determined depending on resolution, pixel density, and the like of the display apparatus 10. In an embodiment, the height of the LED 300 may be greater than the height of the first bank 410, such that the LED 300 protrudes further than an uppermost surface of the first bank 410. FIG. 2 shows an example in which the concave portion 430 is quadrangular in the top plan view, but embodiments of the invention are not limited thereto, and the concave portion 430 may have various planar shapes such as a polygonal shape, a rectangular shape, a circular shape, a conic shape, an oval shape and a triangular shape.

The bank layer 400 may further include a second bank 420 on the first bank 410. A level (step) difference is defined by the first bank 410 and the second bank 420, and a width of the second bank 420 may be narrower than that of the first bank 410. Referring to FIG. 3, for example, widths of the first bank 410 and the second bank 420 are taken parallel to the substrate 101 in a horizontal direction. A conductive layer 550 may be disposed or formed on the second bank 420. The conductive layer 550 may be disposed or formed to be lengthwise extended in the top plan view in a direction parallel to the data line or the scan line of the display part 110, as shown in FIG. 2. The conductive layer 550 is electrically connected to a second electrode 530.

However, the invention is not limited thereto, the second bank 420 may be omitted, and the conductive layer 550 may be disposed or formed on the first bank 410. Alternatively, as shown in FIG. 4, the second bank 420 and the conductive layer 550 may both be omitted, and the second electrode 530 may be disposed or formed over an entirety of the substrate 101 as a common electrode that is common to each of the pixels P.

The first bank 410 and the second bank 420 may include a material at least a portion of light, a light reflective material, or a light scattering material. The first bank 410 and the second bank 420 may include an insulating material which is translucent or opaque to visible light (e.g., light in a wavelength range of about 380 nanometers (nm) to about 750 nm).

For example, the first bank 410 and the second bank 420 may include a thermoplastic resin such as PC, PET, polyether sulfone, polyvinyl butyral, polyphenylene ether, polyamide, polyether imide, a norbornene system resin, a methacrylic resin, or a cyclic polyolefin system resin, a thermosetting resin such as an epoxy resin, a phenol resin, an urethane resin, an acryl resin, a vinyl ester resin, an imide-based resin, an urethane-based resin, an urea resin, or a melamine resin, or an organic insulating material such as polystyrene, polyacrylonitrile, or PC, but are not limited thereto.

As another example, the first bank 410 and the second bank 420 may include an inorganic insulating material of an inorganic oxide or an inorganic nitride such as silicon oxide ($SiO_x$), silicon nitride ($SiN_x$), silicon oxynitride ($SiN_xO_y$), aluminum oxide ($AlO_x$), titanium oxide ($TiO_x$), tantalum oxide ($TaO_x$), or zinc oxide ($ZnO_x$) but are not limited thereto. In an embodiment, the first bank 410 and the second bank 420 may include an opaque material such as a black matrix material.

The black matrix material may include an organic resin, a resin or a paste including a glass paste and a black pigment, metal particles, e.g., Ni, Al, Mo, or an alloy thereof, metal oxide particles (e.g., chromium oxide), metal nitride particles (e.g., chromium nitride), or the like. In another embodiment, the first bank 410 and the second bank 420 may be distributed Bragg reflectors ("DBRs") having a relatively high reflectance or mirror reflectors including a metal.

The LED 300 is located in the concave portion 430. The LED 300 may be electrically connected to the first electrode 510 also in the concave portion 430.

The LED 300 emits light having a wavelength of an ultraviolet ray or a red, green or blue color and may realize white light by using a fluorescent material or combining colored lights. The LED 300 may be a micro LED. Herein, the term "micro" may indicate a size of about 1 micrometer (μm) to about 100 micrometers (μm), but embodiments of the invention are not limited thereto. The LED 300 may also be applied to an LED having a size that is larger or smaller than the micro LED. In a method of manufacturing the display apparatus, a plurality of LEDs 300 may be individually or simultaneously transferred from a carrier wafer by means of transport equipment and transferred to a target such as the substrate 101, where the transferring of the plurality of the LEDs 300 respectively accommodates the LEDs 300 in the concave portion 430 provided in plural.

The LED 300 may include a p-n diode 380, a first contact electrode 310 located at one side of the p-n diode 380, and a second contact electrode 390 located at a side of the p-n diode 380 opposite to that of the first contact electrode 310.

The p-n diode 380 may include a first semiconductor layer 330, a second semiconductor layer 370, and an intermediate layer 350 between the first semiconductor layer 330 and the second semiconductor layer 370.

The first semiconductor layer 330 may be implemented by, for example, as a p-type semiconductor layer. The p-type semiconductor layer may include or be formed using a semiconductor material having an empirical formula of $In_xAl_yGa_{1-x-y}N$ ($0 \leq x \leq 1$, $0 \leq y \leq 1$, $0 \leq x+y \leq 1$) selected from among, for example, GaN, AlN, AlGaN, InGaN, InN, InAlGaN, AlInN, and the like and doped with a p-type dopant such as Mg, Zn, Ca, strontium (Sr), or barium (Ba). The first contact electrode 310 may be disposed or formed under the first semiconductor layer 330.

The second semiconductor layer 370 may be implemented by, for example, an n-type semiconductor layer. The n-type semiconductor layer may be formed using a semiconductor material having an empirical formula of $In_xAl_yGa_{1-x-y}N$ ($0 \leq x \leq 1$, $0 \leq y \leq 1$, $0 \leq x+y \leq 1$) selected from among, for example, GaN, AlN, AlGaN, InGaN, InN, InAlGaN, AlInN, and the like and doped with an n-type dopant such as Si, Ge, or Sn. The second contact electrode 390 may be disposed or formed on the second semiconductor layer 370.

However, the invention is not limited thereto, and the first semiconductor layer 330 may include an n-type semiconductor layer, and the second semiconductor layer 370 may include a p-type semiconductor layer.

The intermediate layer 350 is a region in which electrons and holes are re-coupled, where the recoupling of electrons and holes causes transition to a relatively low energy level, and light having a wavelength corresponding to the energy transition is generated. The intermediate layer 350 may include or be formed with a semiconductor material having, for example, an empirical formula of $In_xAl_yGa_{1-x-y}N$ ($0 \leq x \leq 1$, $0 \leq y \leq 1$, $0 \leq x+y \leq 1$) and may be formed in a single quantum well ("SQW") structure or a multi quantum well ("MQW") structure. Alternatively, the intermediate layer 350 may include a quantum wire structure or a quantum dot structure.

The first contact electrode 310 and/or the second contact electrode 390 may include one or more layers and may be formed using various conductive materials including a metal, a conductive oxide, and a conductive polymer. The first contact electrode 310 may be in contact with the first electrode 510, and the second contact electrode 390 may be in connection and/or contact with the second electrode 530.

The first electrode 510 may include a reflective layer including Ag, Mg, Al, Pt, Pd, Au, Ni, Nd, Ir, Cr, or a compound thereof and a transparent or translucent electrode layer disposed or formed on the reflective layer. The transparent or translucent electrode layer may include at least one of indium tin oxide ("ITO"), indium zinc oxide ("IZO"), zinc oxide ("ZnO"), indium oxide ($In_2O_3$), indium gallium oxide ("IGO"), and aluminum zinc oxide ("AZO").

The second electrode 530 may be a transparent or translucent electrode and may include a metal thin film having a relatively small work function and including Li, Ca, lithium fluoride (LiF)/Ca, LiF/Al, Al, Ag, Mg, or a compound thereof. In addition, an assistant electrode layer or a bus electrode may be further disposed or formed on the metal thin film by using a transparent electrode forming material such as ITO, IZO, ZnO, or $In_2O_3$. Therefore, the second electrode 530 may transmit light emitted from the LED 300.

However, while the display apparatus 10 is described as the top emission type, the invention is not limited thereto, and the display apparatus 10 may be a bottom emission type in which light emitted from the LED 300 is emitted toward the substrate 101. In the bottom emission type display apparatus 10, the first electrode 510 may be a transparent or translucent electrode, and the second electrode 530 may be a reflective electrode. Alternatively, the display apparatus 10 may be a dual emission type in which light is emitted in both directions, that is, in a front surface direction and a rear surface direction.

The LED 300 may further include an insulating member 320 surrounding the first contact electrode 310. The insulating member 320 may surround at least an edge of the first contact electrode 310 and define an opening 323 thereof through which a surface of the first contact electrode 310 is exposed.

The first electrode member may include the first electrode 510 as a planar portion of the first electrode member. The first electrode member may further include or define a protruding portion 512 thereof which extends from an upper surface of the first electrode 510.

In addition, the protruding portion 512 extends into the opening 323 such that the protruding portion 512 is in contact with the first contact electrode 310. The first electrode 510 and/or the protruding portion 512 thereof may contact the exposed surface of the first contact electrode 310. Therefore, when the LED 300 is mounted on the first electrode member, a mounting location of the LED 300 may be easily determined due to the protruding portion 512 protruded from the first electrode 510, and the LED 300 may be easily mounted at an accurate location by coupling of the protruding portion 512 protruding from the first electrode 510 with the first contact electrode 310 at the opening 323.

A horizontal cross-sectional area of the opening 323 may gradually increase in a direction from the first contact electrode 310 to the first electrode 510. In an exemplary embodiment, for example, an inner side surface 322 of the insulating member 320 which defines or forms the opening 323 may define an inclined surface with respect to the first electrode 510 and having a first gradient. In addition, an outer side surface (513 of FIG. 9) of the protruding portion 512 defined thereby may define an inclined surface with respect to the first electrode and having a second gradient. The second gradient may complement the first gradient. Therefore, with the first and second gradients described above, the protruding portion 512 may be easily accommodated into the opening 323, and the protruding portion 512 extended into the opening 323 may be guided by the inner side surface 322 of the insulating member 320 to be in contact with the first contact electrode 310 at an accurate location.

In addition, to easily insert the protruding portion 512 into the opening 323, the second gradient of the outer side surface (513 of FIG. 9) of the protruding portion 512 may be equal to or less than the first gradient of the inner side surface 322 of the insulating member 320. In addition, for stable conductivity, a maximum distance (length) from a lowermost surface of the insulating member 320 to the exposed surface of the first contact electrode 310, e.g., a depth of the opening 323 (vertical in FIG. 5), may be equal to or less than a maximum height of the protruding portion 512. The height of the protruding portion 512 is defined from the upper surface of the first electrode 510 to a distal end of the protruding portion 512. That is, the height of the protruding portion 512 may exclude a cross-sectional thickness of the planar first electrode 510. An upper surface of the protruding portion 512 at the distal end thereof may define a flat surface. That is, a vertical cross-section of the protruding portion 512 may be a trapezoidal shape in which a width of the upper side thereof is smaller than that of the lower side thereof.

The protruding portion 512 may include one or more layers and may be formed using various conductive materials including a metal, a conductive oxide, and a conductive polymer. The protruding portion 512 may be disposed or formed in a one body with the first electrode 510. Portions of the one body as a first electrode member may define the first electrode 510 and the protruding portion 512. However, the invention is not limited thereto.

The first electrode 510 may be disposed or formed such that the first electrode 510 is lengthwise extended in a line shape along the direction of X-X' and has inclined side surfaces at sides in a direction perpendicular to the direction of X-X'. Here, the opening 323 of the insulating member 320 may be disposed or formed to be lengthwise extended in a line shape along the direction of X-X' and having a depth up to mutually facing side surfaces of the insulating member 320 along a longitudinal direction of the first electrode 510.

A passivation layer 520 surrounds the LED 300 inside the concave portion 430. The passivation layer 520 covers the concave portion 430 and the first electrode 510 by filling in a space between the bank layer 400 and the LED 300. The passivation layer 520 may include an organic insulating material. In an exemplary embodiment, for example, the passivation layer 520 may include acryl, PMMA, benzocyclobutene ("BCB"), polyimide, acrylate, epoxy, polyester, or the like but is not limited thereto.

The passivation layer 520 may be disposed or formed with a height not to cover (e.g., not overlap) an upper part of the LED 300, e.g., at the second contact electrode 390, such that the second contact electrode 390 is exposed by the passivation layer 520. The second electrode 530 electrically connected to the exposed second contact electrode 390 of the LED 300 may be disposed or formed on the passivation layer 520.

Although the vertical-type LED 300 in which the first contact electrode 310 and the second contact electrode 390 are located at opposite sides from each other has been described, the invention is not limited thereto. The LED 300 may be a lateral-type or flip-type LED 300 in which the first contact electrode 310 and the second contact electrode 390 are located to be oriented in a same direction, that is, at a same side of the LED 300. In the lateral-type or flip-type LED 300, locations of the first electrode 510 and the second electrode 530 may be respectively located to correspond to locations of the first contact electrode 310 and the second contact electrode 390.

FIGS. 6(a) and 6(b) to FIG. 9 illustrate an exemplary embodiment of a method of manufacturing the display apparatus 10 of FIG. 1, according to the invention.

Referring to FIG. 3, and FIGS. 6(a) to 9, an exemplary embodiment of the method according to the invention may include arranging a plurality of p-n diodes 380 on a carrier substrate 203 to be spaced apart from each other, forming a plurality of LEDs 300 by forming the first contact electrode 310 on each of the plurality of p-n diodes 380, forming an insulating layer material 321 on the carrier substrate 203 and patterning the insulating layer material 321 to form the insulating member 320 surrounding the first contact electrode 310, and mounting the LEDs 300 on the display substrate 100 having the first electrode 510.

Figure 6A:
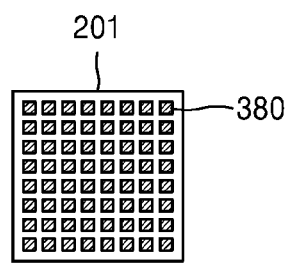

As shown in FIG. 6(a), the p-n diode 380 may be formed in plural on a base substrate 201. The plurality of p-n diodes 380 may be spaced apart from each other at a first spacing on the base substrate 201. The base substrate 201 may be a conductive or insulating substrate including, for example, at least one of sapphire ($Al_2O_3$), silicon carbide (SiC), Si, gallium arsenide GaAs, GaN, ZnO, gallium phosphide (GaP), InP, Ge, and $Ga_2O_3$.

Figure 6B:
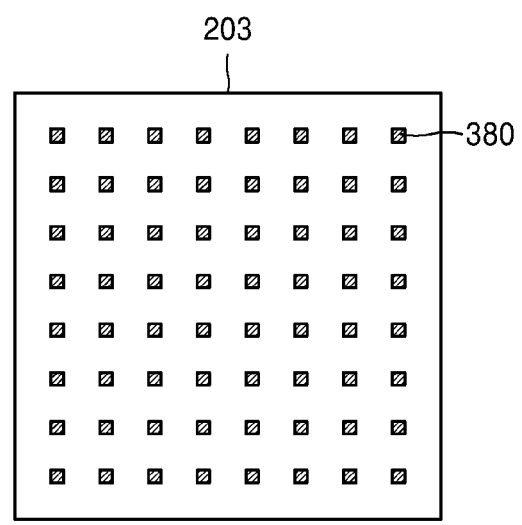

Each of the plurality of p-n diodes 380 may include the first semiconductor layer 330, the second semiconductor layer 370, and the intermediate layer 350 between the first semiconductor layer 330 and the second semiconductor layer 370. The first semiconductor layer 330, the intermediate layer 350 and the second semiconductor layer 370 may be formed using a method such as metal organic chemical vapor deposition ("MOCVD"), chemical vapor deposition ("CVD"), plasma-enhanced chemical vapor deposition ("PECVD"), molecular beam epitaxy ("MBE"), or hydride vapor phase epitaxy ("HVPE"). Referring to FIG. 6(b), the plurality of p-n diodes 380 formed on the base substrate 201 are separated from the base substrate 201 and arranged on the carrier substrate 203 to be spaced apart from each other at a second spacing. The second spacing may be different than the first spacing.

Figure 7:
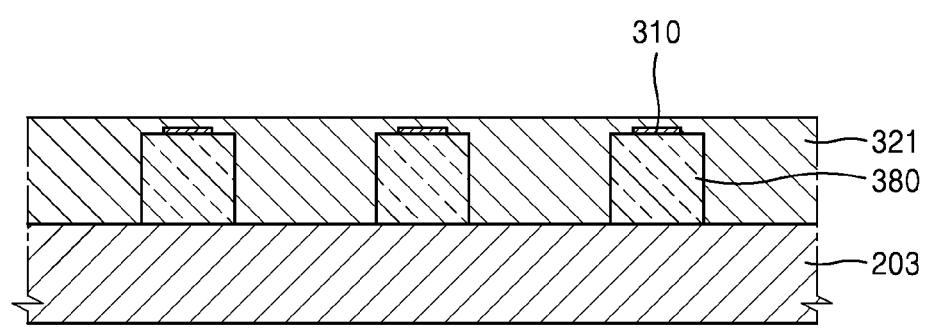

Thereafter, as shown in FIG. 7, a first contact electrode 310 is formed on one side of each of the plurality of p-n diodes 380, and the insulating layer material 321 is formed on the carrier substrate 203 having the plurality of p-n diodes 380 and first contact electrodes 310 thereon. The first contact electrode 310 may be provided in plural to respectively correspond to the plurality of p-n diodes 380.

The first contact electrode 310 may include one or more layers and be formed using various conductive materials including a metal, a conductive oxide, and a conductive polymer.

The insulating layer material 321 may be formed by a method such as inkjet printing, screen printing, lamination, spin coating, sputtering, or CVD using an inorganic material such as $SiO_2$, $SiN_x$, SiON, or $Al_2O_3$.

Figure 8:
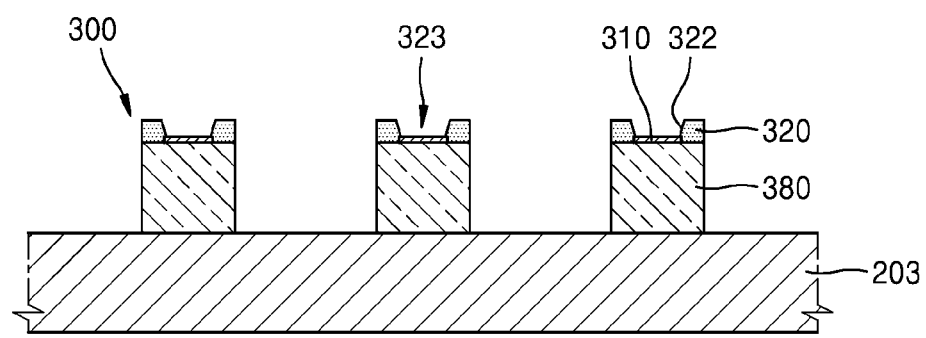

Thereafter, as shown in FIG. 8, the insulating layer material 321 may be patterned at each p-n diode 380 to form an insulating member 320 provided in plural, each insulating member 320 surrounding the first contact electrode 310, such as in a top plan view. In addition, the insulating member 320 may define the opening 323 through which the surface of the first contact electrode 310 is exposed. The insulating layer material 321 may be patterned by wet or dry etching.

The inner side surface 322 of the insulating member 320 at the opening 323 may define an inclined surface with respect to the first contact electrode 310 and having the first gradient, and a horizontal cross-sectional area of the insulating member 320 may gradually increase in a direction away from the first contact electrode 310.

The plurality of LEDs 300 formed as described above may be individually or simultaneously picked up or separated from the carrier substrate 203 by means of transport equipment, and transferred to a target substrate such as the display substrate 100.

Figure 9:
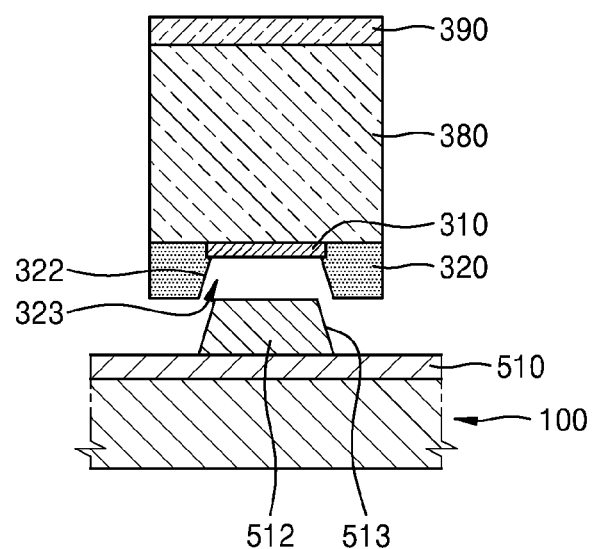

Referring to FIG. 3 and FIG. 9, the display substrate 100 includes the first electrode 510 and the first electrode 510 may include or define the protruding portion 512.

The protruding portion 512 is inserted into the opening 323 when the LED 300 is mounted onto the display substrate 100, such that the LED 300 is easily mounted and stably connected electrically to the first electrode 510.

The outer side surface 513 of the protruding portion 512 may define an inclined surface with respect to the first electrode 510, the inclined surface having the second gradient. Therefore, the protruding portion 512 may be easily inserted into the opening 323, and the protruding portion 512 inserted into the opening 323 may be guided by the inner side surface 322 of the insulating member 320 at the opening 323, to be in contact with the first contact electrode 310 at an accurate location.

In addition, to easily insert the protruding portion 512, the second gradient of the outer side surface 513 of the protruding portion 512 may be equal to or less than the first gradient of the inner side surface 322 of the insulating member 320 at the opening 323. In addition, for stable conductivity, the maximum length from a lowermost surface of the insulating member 320 to the exposed surface of the first contact electrode 310, e.g., the depth of the opening 323, may be equal to or less than the maximum height of the protruding portion 512, and the upper surface of the protruding portion 512 at the distal end thereof may define a flat surface. That is, a vertical cross-section of the protruding portion 512 may be a trapezoidal shape for which a width of the upper side thereof is smaller than that of the lower side thereof.

Referring to FIG. 9, the thin-film transistor TFT, the planarization layer 117 on the thin-film transistor TFT, and the bank layer 400 on the planarization layer 117 are already formed within the display substrate 100 having the first electrode 510 (refer to FIG. 3), and such elements are omitted for convenience of illustration.

The thin-film transistor TFT may be electrically connected to the first electrode 510 through or at a via hole formed in the planarization layer 117.

Referring again to FIG. 3, the bank layer 400 defines a pixel region of the display apparatus 10 and may define the concave portion 430. The LED 300 is mounted inside the concave portion 430. In addition, the concave portion 430 may be filled with the passivation layer 520.

The LED 300 further includes the second contact electrode 390 at a side of the LED 300 opposite to that of the first contact electrode 310. The second contact electrode 390 may be exposed from the passivation layer 520, and the second electrode 530 in contact with the exposed second contact electrode 390 may be formed on the passivation layer 520.

As described above, the LED 300 may be easily mounted on the target display substrate 100 at an accurate location, and an electrical connection between the LED 300 and the first electrode 510 may be stably achieved.

According to one or more exemplary embodiments, when LEDs are mounted on a display substrate, the LEDs may be easily mounted at accurate locations on the display substrate, and electrical connections of the LEDs may be stably performed at such locations.

It should be understood that exemplary embodiments described herein should be considered in a descriptive sense only and not for purposes of limitation. Descriptions of features within each exemplary embodiment should typically be considered as available for other similar features in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
    providing a display substrate of the display apparatus, the display substrate comprising:
        a first electrode, and
        a protruding portion which protrudes from the first electrode;
    providing a plurality of light-emitting diodes of the display apparatus by:
        providing a plurality of p-n diodes arranged spaced apart from each other on a carrier substrate;
        providing for each light-emitting diode among the plurality of light-emitting diodes:
            a first contact electrode at a side of each p-n diode among the plurality of p-n diodes on the carrier substrate; and
            an insulating member on each p-n diode and the first contact electrode, to expose a surface of the first contact electrode, the insulating member protruding in a direction away from each p-n diode and extending farther than the exposed surface of the first contact electrode, the insulating member defining:
                an opening which exposes the exposed surface of the first contact electrode,
                a horizontal cross-sectional area of the opening which increases in a direction from the first contact electrode to the first electrode,
                a vertical cross-section of the protruding portion which is trapezoidal, and
                an inner side surface at the opening which is an inclined surface having a first gradient with respect to the first electrode,
            wherein the protruding portion defines an outer side surface thereof which faces the inner side surface of the insulating member, and the outer side surface is an inclined surface having a second gradient with respect to the first electrode; and
    providing the light-emitting diodes in connection with the display substrate of the display apparatus by inserting the protruding portion into the opening such that the protruding portion is in contact with the exposed surface of the first contact electrode.

2. The method of claim 1, wherein the second gradient is equal to or less than the first gradient.

3. The method of claim 1, wherein
    the opening defined by the insulating member is recessed from a lower surface thereof, and
    a maximum height of the protruding portion is equal to or greater than a maximum depth of the opening taken from the lower surface of the insulating member to the exposed surface of the first contact electrode.

4. The method of claim 1, wherein
    the display substrate further comprises:
        a substrate,
        a bank layer which is on the substrate, and defines a pixel region and a concave portion in plural,
        a thin-film transistor on the substrate, and
        a planarization layer between the thin-film transistor and the first electrode,
        wherein the first electrode is electrically connected to the thin-film transistor, and
    the providing the light-emitting diodes in connection with the display substrate comprises providing each of the light-emitting diodes respectively inside the concave portions of the display substrate.

5. The method of claim 4, further comprising providing a passivation layer which fills a space between the bank layer and the light-emitting diodes in the concave portions.

6. The method of claim 5, further providing for each light-emitting diode among the plurality of light-emitting diodes:
- a second contact electrode at a side of each p-n diode which is opposite to the side at which the first contact electrode is disposed, respectively, wherein the second contact electrode is exposed by the passivation layer filled in the concave portions.

7. The method of claim 6, further comprising:
providing a second electrode on the passivation layer and in contact with the second contact electrode exposed by the passivation layer.

8. A method of manufacturing a display apparatus, the method comprising
- providing a display substrate of the display apparatus, the display substrate comprising a first electrode member including a protruding portion;
- providing a light-emitting diode of the display apparatus by:
  - providing a p-n diode on a carrier substrate;
  - providing a first contact electrode at a side of the p-n diode on the carrier substrate; and
  - providing an insulating member on the p-n diode and the first contact electrode on the carrier substrate, wherein
    - the p-n diode, the first contact electrode and the insulating member are movable together with each other relative to the display substrate, and
    - the insulating member which is movable together with the p-n diode and the first contact electrode extends in a direction away from the p-n diode and farther than the first contact electrode and defines:
      - an opening which exposes a surface of the first contact electrode to an outside of the light-emitting diode,
      - a horizontal cross-sectional area of the opening which increases in a direction from the first contact electrode to the first electrode member,
      - a vertical cross-section of the protruding portion which is trapezoidal, and
      - an inner side surface at the opening which is an inclined surface having a first gradient with respect to the first electrode member,
    - wherein the protruding portion defines an outer side surface thereof which faces the inner side surface of the insulating member, and the outer side surface is an inclined surface having a second gradient with respect to the first electrode member; and
- providing the protruding portion of the first electrode member of the display apparatus in the opening defined by the insulating member movable together with the p-n diode and the first contact electrode, which provides the protruding portion of the first electrode member in contact with the surface of the first contact electrode which is exposed to the outside of the light-emitting diode.

\* \* \* \* \*